(12) United States Patent
Tsuchiya et al.

(10) Patent No.: US 11,976,220 B2
(45) Date of Patent: May 7, 2024

(54) POLISHING COMPOSITION AND METHOD FOR PRODUCING SAME

(71) Applicant: FUJIMI INCORPORATED, Kiyosu (JP)

(72) Inventors: Kohsuke Tsuchiya, Kiyosu (JP); Hisanori Tansho, Kiyosu (JP); Yusuke Suga, Kiyosu (JP); Taiki Ichitsubo, Kiyosu (JP); Takayuki Takemoto, Nagoya (JP); Naohiko Saito, Nagoya (JP); Michihiro Kaai, Nagoya (JP)

(73) Assignee: FUJIMI INCORPORATED, Kiyosu (JP)

(*) Notice: Subject to any disclaimer, the term of this patent is extended or adjusted under 35 U.S.C. 154(b) by 0 days.

(21) Appl. No.: 17/870,663

(22) Filed: Jul. 21, 2022

(65) Prior Publication Data

US 2023/0073290 A1 Mar. 9, 2023

Related U.S. Application Data

(62) Division of application No. 16/761,302, filed as application No. PCT/JP2018/038982 on Oct. 19, 2018, now Pat. No. 11,421,131.

(30) Foreign Application Priority Data

Nov. 6, 2017 (JP) .................. 2017-214204

(51) Int. Cl.
*C09G 1/02* (2006.01)
*B24B 37/04* (2012.01)
*H01L 21/306* (2006.01)

(52) U.S. Cl.
CPC .............. *C09G 1/02* (2013.01); *B24B 37/044* (2013.01); *H01L 21/30625* (2013.01)

(58) Field of Classification Search
None
See application file for complete search history.

(56) References Cited

U.S. PATENT DOCUMENTS

| 2004/0098924 | A1 | 5/2004 | Iwasa |
| 2008/0053001 | A1 | 3/2008 | Noguchi et al. |
| 2008/0311750 | A1 | 12/2008 | Izumi et al. |
| 2016/0122591 | A1 | 5/2016 | Tsuchiya et al. |
| 2016/0272846 | A1* | 9/2016 | Tsuchiya .............. C09K 3/1436 |
| 2017/0253767 | A1 | 9/2017 | Tsuchiya et al. |
| 2019/0077992 | A1 | 3/2019 | Tsuchiya et al. |

FOREIGN PATENT DOCUMENTS

| CN | 105051145 A | 11/2015 |
| JP | 2004-128089 A | 4/2004 |
| JP | 2008-053414 A | 3/2008 |
| JP | 2015-078318 A | 4/2015 |
| JP | 2016-213216 A | 12/2016 |
| JP | 2017-011220 A | 1/2017 |
| TW | 201533069 A | 9/2015 |
| WO | WO-2014/148399 A1 | 9/2014 |
| WO | WO-2014/196299 A1 | 12/2014 |
| WO | WO-2015/053207 A1 | 4/2015 |
| WO | WO-2015/068672 A1 | 5/2015 |
| WO | WO-2017/170179 A1 | 10/2017 |

OTHER PUBLICATIONS

Extended European Search Report issued in corresponding European Patent Application No. 18871893.6 dated Jul. 21, 2021 (8 pages).
International Preliminary Report on Patentability issued in corresponding application No. PCT/JP2018/038982 dated May 22, 2020 with English translation (27 pages).
International Search Report and Written Opinion of the International Searching Authority issued in corresponding application No. PCT/JP2018/038982 dated Nov. 27, 2018 with English translation (29 pages).
Office Action for Taiwanese application No. 107138715 dated Mar. 14, 2022.
Office Action issued in corresponding Chinese Patent Application No. 201880071813.6 dated Mar. 4, 2021, with English machine translation (14 pages).
Polymer Properties Database, "Retardation and Inhibition of Vinyl Polymerization", retrieved from "https://polymerdatabase.com/polymer%20chemistry/radical%20mechanism.html" on Oct. 28, 2021 (2016 as dated by the web Wayback Machine), pp. 1-3.
U.S. Notice of Allowance on U.S. Appl. No. 16/761,302 dated Apr. 8, 2022 (8 pages).
U.S. Office Action on U.S. Appl. No. 16/761,302 dated Dec. 2, 2021 (11 pages).
U.S. Office Action on U.S. Appl. No. 16/761,302 dated May 19, 2021 (10 pages).
KR Office Action issued in corresponding Korean Patent Application No. 10-2020-7015897, dated Sep. 12, 2023 (7 pages).

* cited by examiner

*Primary Examiner* — Stephanie P Duclair
(74) *Attorney, Agent, or Firm* — FOLEY & LARDNER LLP

(57) ABSTRACT

Provided is a polishing composition which contains a water-soluble polymer and is suitable for reducing LPDs. The polishing composition provided in this application includes an abrasive, a water-soluble polymer, and a basic compound. In the polishing composition, the content of a reaction product of a polymerization initiator and a polymerization inhibitor is 0.1 ppb or less of the polishing composition on a weight basis.

14 Claims, No Drawings

POLISHING COMPOSITION AND METHOD FOR PRODUCING SAME

The present application is a Divisional of U.S. application Ser. No. 16/761,302, filed Oct. 19, 2018, which in turn is a 371 (National Stage) of PCT/JP2018/038982, filed Oct. 19, 2018, which claims priority to Japanese Patent Application No. 2017-214204, filed on Nov. 6, 2017, and the entire contents thereof are incorporated herein by reference.

TECHNICAL FIELD

The present invention related to a polishing composition and a method for producing the same.

BACKGROUND ART

A polishing process called chemical mechanical polishing (CMP) is widely used as a technique for smoothing a silicon wafer (hereinafter simply referred to as a wafer). A polishing composition containing fine abrasive particles and a basic compound is used in CMP. In the CMP process, mechanical polishing with such an abrasive and chemical polishing with a basic compound proceed simultaneously, and thus a wide range of surface of a wafer can be smoothed with high precision.

Generally, in a wafer polishing process according to CMP, 3- to 4-step polishing is performed to realize high precision smoothing. In the first half of the polishing process, mainly for rough polishing, a high polishing removal rate tends to be required. On the other hand, the latter half of the polishing process is mainly for finishing the wafer to have a smoother surface with higher quality. A method using a polishing composition containing a water-soluble polymer is known as a method for obtaining a highly smooth surface (Patent Document 1 to 3).

CITATION LIST

Patent Document

[Patent Document 1] Japanese Patent Application Publication No. 2004-128089
[Patent Document 2] WO 2014/148399
[Patent Document 3] WO 2014/196299

SUMMARY OF INVENTION

Technical Problem

Along with further miniaturization of a semiconductor wiring, it is desired to further reduce the number of micro defects generally called light point defects (LPDs), as well as to obtain high smoothness. Here, an object of the present invention is to provide a polishing composition which contains a water-soluble polymer and is suitable for reducing LPDs. Another related object is to provide a method for producing such a polishing composition.

Solution to Problem

The inventors have focused on that there may be a product of the reaction (hereinafter simply referred to as a "reaction product") of a polymerization inhibitor derived from a monomer or the like used as a raw material and a polymerization initiator in a polishing composition containing a water-soluble polymer. The inventors found that limiting the content of the reaction product to a certain value or less is effective in reducing LPDs, and completed the present invention.

A polishing composition provided in this specification includes an abrasive, a water-soluble polymer, and a basic compound. In the polishing composition, a content of a reaction product of a polymerization initiator and a polymerization inhibitor is 0.1 ppb or less of the polishing composition on a weight basis. Such a reaction product is likely to be adsorbed on the surface of an object to be polished, and may cause the generation of LPDs. When the content of the reaction product is reduced to 0.1 ppb or less, the generation of LPDs due to adsorption of the reaction product is prevented, and LPDs can be reduced as a whole.

In addition, in this specification, provided is a method for producing any of the polishing compositions disclosed herein. The method includes preparing a polymer composition containing the water-soluble polymer. Here, a content of the reaction product in the polymer composition is 0.1 ppb or less with respect to the polishing composition on a weight basis. The method further includes mixing the polymer composition, the abrasive, and the basic compound. With the use of the polymer composition in which the content of the reaction product is limited to a designated value or less, it is possible to appropriately produce a polishing composition disclosed herein.

DESCRIPTION OF EMBODIMENTS

Preferred embodiments of the present invention will be described below. Matters necessary to implement this invention other than those specifically referred to in this specification may be understood as design matters to a person of ordinary skill in the art based on the conventional art in the pertinent field. The present invention can be implemented based on the content disclosed herein and common technical knowledge in the field.

As used herein. "(meth)acrylic" comprehensively refers to acrylic and methacrylic, and "(meth)acrylate" comprehensively refers to acrylate and methacrylate. Similarly, "(meth)acryloyl group" comprehensively refers to an acryloyl group and a methacryloyl group.

Abrasive

A polishing composition disclosed herein contains an abrasive. The abrasive has a function of mechanically polishing a surface of an object to be polished.

The abrasive is not particularly limited, and various known abrasive that can be used in polishing composition for objects to be polished such as wafers can be used. Examples of such abrasives include silica particles, inorganic particles other than silica particles, organic particles, and organic-inorganic composite particles. One type of abrasive can be used or two or more types of abrasives can be used in combination.

The abrasive in the art disclosed herein, inorganic particles are preferable, and among these, particles composed of an oxide of metal or metalloid are preferable, and silica particles are particularly preferable. In polishing of an object to be polished having a surface made of silicon such as a silicon substrate, for example, in a polishing composition that can be used for finish polishing, it is particularly significant to use silica particles as the abrasive. The art disclosed herein can be preferably implemented in an embodiment in which the abrasive substantially consists of silica particles. Here. "substantially" means that 95 wt % or more, preferably 98 wt % or more, or more preferably 99 wt % or more of particles constituting the abrasive are silica particles, and includes the case in which 100 wt % thereof are silica particles.

Specific examples of silica particles include colloidal silica, fumed silica, and precipitated silica. Silica particles can be used singly or in a combination of two or more. Colloidal silica is particularly preferably used because it tends to facilitate obtaining a polished surface having excellent surface quality after polishing. As the colloidal silica, for example, colloidal silica obtained from water glass (sodium silicate) as a raw material using an ion exchange method, or alkoxide-method colloidal silica can be preferably used. Alkoxide-method colloidal silica is colloidal silica produced according to a hydrolysis and condensation reaction of an alkoxysilane. Colloidal silicas can be used singly or in a combination of two or more.

The average primary particle size of the abrasive is not particularly limited. In consideration of a polishing removal rate and the like, it is preferably 5 nm or more, and more preferably 10 nm or more. In view of improving the polishing effect, for example, it is preferably 15 nm or more, more preferably 20 nm or more, and still more preferably more than 20 nm. In addition, in view of improving the smoothness, the average primary particle size of the abrasive is preferably 100 nm or less, more preferably 50 nm or less, and still more preferably 40 nm or less.

Here, the average primary particle size in this specification is a particle size calculated from a specific surface area (BET value) measured by a BET method according to the formula of average primary particle size [nm]=6,000/(true density [g/cm$^3$]×BET value [m$^2$/g]). For example, in the case of silica particles, the average primary particle size can be calculated according to the average primary particle size [nm]=2,727/BET value[m$^2$/g]. The specific surface area can be measured using, for example, a surface area measuring device, product name "Flow Sorb II 2300" available from Micromeritics Instrument Corporation.

The average secondary particle size of the abrasive is not particularly limited, and can be appropriately selected from, for example, a range of about 10 nm to 500 nm. In consideration of a polishing removal rate and the like, the average secondary particle size of the abrasive may be, for example, 15 nm or more, 20 nm or more, or 30 nm or more. In view of improving the polishing effect, in some embodiments, the average secondary particle size of the abrasive may be 35 nm or more, 40 nm or more, or more than 40 nm. In view of improving the smoothness, the average secondary particle size of the abrasive is generally appropriately 200 nm or less, preferably 150 nm or less, and more preferably 100 nm or less. In order to facilitate obtaining a higher quality surface, in some embodiments, the average secondary particle size of the abrasive may be 75 nm or less or 70 nm or less. Here, the average secondary particle size of the abrasive in this specification is the average particle size measured based on a dynamic light scattering method. The average particle size can be measured using, for example, model "UPA-UT151", available from Nikkiso Co., Ltd.

The shape (outer shape) of particles constituting the abrasive, also referred to as abrasive particles hereinafter, may be globular or non-globular. Specific examples of non-globular particles include a peanut shape, a cocoon shape, a konpeito shape, and a rugby ball shape. The peanut shape herein refers to a peanut shell shape. For example, an abrasive in which most of particles have a peanut shape or a cocoon shape can be preferably used.

Although not particularly limited, the average aspect ratio of the abrasive, that is, the average value of ratios of major axis/minor axis of the particles constituting the abrasive is, in principle, 1.0 or more, preferably 1.05 or more, and more preferably 1.1 or more. Higher polishing efficiency can be realized by increasing the average aspect ratio. In view of reducing scratches and the like, the average aspect ratio of the abrasive is preferably 3.0 or less, more preferably 2.0 or less, and still more preferably 1.5 or less.

The shape (outer shape) and average aspect ratio of particles constituting the abrasive can be determined by, for example, observation under an electron microscope. In a specific procedure of determining an average aspect ratio, for example, using a scanning electron microscope (SEM), the smallest rectangles circumscribing particle images are drawn for a predetermined number of abrasive particles whose particle shapes can be independently recognized. The predetermined number is, for example, 200. Then, regarding the rectangles drawn for the particle images, the lengths of the long sides are defined as values of the major axes, the lengths of the short sides are defined as values of the minor axes, and values obtained by dividing the values of the major axes by the values of the minor axes are calculated as ratios of major axis/minor axis of the particles, that is, aspect ratios. The average aspect ratio can be obtained by arithmetically averaging the aspect ratios of the predetermined number of particles.

The content of the abrasive in the composition can be appropriately selected in consideration of the type of the abrasive, a polishing removal rate and a dispersion stability. For example, the content of the abrasive can be 0.001 wt % or more and 10 wt % or less with respect to the total weight of the composition. The content can be 0.01 wt % or more and 5 wt % or less, and can further be 0.1 wt % or more and 1 wt % or less. When the content of the abrasive is 0.001 wt % or more, for example, a polishing removal rate of mechanical polishing can be secured, and when the content of the abrasive is 10 wt % or less, the dispersion stability of the abrasive can be secured. As will be described below, the content of the abrasive can be preferably applied to the content in a working slurry supplied to the object to be polished.

Water-Soluble Polymer

The water-soluble polymer is not particularly limited, and a known water-soluble polymer that can be used in a polishing composition can be appropriately selected and used. Examples of water-soluble polymers include cellulose derivatives, starch derivatives, polymers including an oxyalkylene unit, vinyl alcohol-based polymers, acrylic acid-based polymers, and nitrogen-atom-containing polymers. Examples of cellulose derivatives include nitrocellulose, acetyl cellulose, and carboxymethyl cellulose. Examples of starch derivatives include amylose, amylopectin, and pullulan as well as starch. Examples of polymers including an oxyalkylene unit include random copolymers and block copolymers of ethylene oxide and propylene oxide, and polyethylene glycol. Here, the vinyl alcohol-based polymer is a polymer having a structural part represented by the following chemical formula: —CH$_2$—CH(OH)—; as a repeating unit (hereinafter referred to as a VA unit) constituting the polymer. The VA unit can be produced by, for example, hydrolysis (also referred to as saponification) of a repeating unit of a structure obtained by vinyl polymerization of a vinyl ester type monomer such as vinyl acetate. A polymer generally called as a polyvinyl alcohol is encompassed in the concept of the vinyl alcohol-based polymer disclosed herein. The degree of saponification of the polyvinyl alcohol can be, for example, about 93% to 99%, but is not particularly limited. In addition, a polymer having a non-vinyl alcohol unit (hereinafter referred to as a non-VA unit) in addition to the VA unit can be used as a vinyl alcohol-based polymer disclosed herein. The non-VA unit can be a repeating unit having at least one structure selected from the group consisting of hydrocarbon groups such as an alkyl group, an allyl ether group, an aryl group, an arylalkyl group, and a styrene group: oxyhydrocarbon groups such as an alkoxy group, an aryloxy group, an arylalkyloxy group, and an oxyalkylene group; and a carboxy group, a sulfo group, an amino group, a hydroxy group, an amide group, an imide group, an imino group, an amidino group, an imidazolino group, a nitrile group, an ether group, an ester group, and salts thereof. The molar ratio of VA units:non-VA units can be, for example, about 70:30 to 99:1, but are not particularly limited. Otherexamples of water-soluble polymers include polyisoprene sulfonic acid, polyvinyl sulfonic acid, polyallyl sulfonic acid, polyisoamylene sulfonic acid, polystyrene sulfonate, polyacrylate, and polyvinyl acetate. Water-soluble polymers can be used singly or in a combination of two or more.

In some embodiments of the art disclosed herein, as the water-soluble polymer, a nitrogen-atom-containing polymer can be preferably used. Examples of nitrogen-atom-containing polymers include a polymer having a structural unit derived from a monomer having a nitrogen atom in the molecule. Examples of a monomer containing nitrogen atoms in the molecule (hereinafter referred to as a nitrogen-containing monomer) include N-vinyl-2-pyrrolidone, N-(meth)acryloylmorpholine, (meth)(di)isopropylacrylamide, N,N-dimethyl(meth)acrylamide, and N-hydroxyethyl (meth)acrylamide. Nitrogen-atom-containing polymers may contain, for example, 10 mol % or more and 100 mol % or less, 30 mol % or more and 100 mol % or less, 50 mol % or more and 100 mol % or less, more than 50 mol % and 100 mol % or less, or 70 mol % or more and 100 mol % or less of one or two or more types of structural units derived from such a nitrogen-containing monomer. Herein, the expression that a nitrogen-atom-containing polymer includes X mol % or more of structural units derived from the nitrogen-containing monomer means that the number of structural units derived from the nitrogen-containing monomer among a total number of repeating units constituting the nitrogen-atom-containing polymer is X % or more.

Among these, a polymer having a structural unit derived from N-(meth)acryloylmorpholine (hereinafter referred to as a morpholine polymer) can be preferably used. Such a structural unit has hydrolyzability that is sufficiently suppressed under alkaline conditions, and has excellent usability. For example, it can avoid hydrolysis almost 100% at a pH of 10.0 and a temperature of 25° C. for at least 2 months. In addition, such a structural unit exhibits appropriate adsorption properties with respect to abrasives or wafers. Therefore, even if a water-soluble polymer mainly composed of the structural unit forms a polishing composition together with a basic compound and the like, it exhibits excellent alkali resistance and exhibits favorable etching resistance. In addition, even if a polymer having such a structural unit has a high molecular weight (for example, a weight average molecular weight of about 600.000 or more), an abrasive such as silica particles can be favorably dispersed.

The morpholine polymer preferably has 10 mol % or more and 100 mol % or less of structural units derived from N-(meth)acryloylmorpholine. In the morpholine polymer, the amount of the structural unit derived from N-(meth) acryloylmorpholine is more preferably, for example, 20 mol % or more, 30 mol % or more, 40 mol % or more, or 50 mol % or more, and still more preferably, more than 50 mol %, 60 mol % or more, 70 mol % or more, 80 mol % or more, 90 mol % or more, 95 mol % or more, 98 mol % or more, 99 mol % or more, or 100 mol %. In some embodiments, a morpholine polymer having a structural unit derived from N-(meth)acryloylmorpholine in a range of, for example, 50 mol % or more and 100 mol % or less, preferably 70 mol % or more and 100 mol % or less, and more preferably 90 mol % or more and 100 mol % or less can be used.

In addition to such a structural unit, the morpholine polymer may have a structural unit derived from other monomers that can copolymerize with N-(meth)acryloylmorpholine. The other monomers are not particularly limited, and examples thereof include (meth)acrylic acid alkyl esters such as methyl(meth)acrylate, ethyl(meth)acrylate, butyl(meth)acrylate and 2-ethylhexyl(meth)acrylate; unsaturated acids such as (meth)acrylic acid, crotonic acid, maleic acid, itaconic acid and fumaric acid, and alkyl esters thereof; unsaturated acid anhydrides such as maleic anhydride; sulfonic acid group-containing monomers such as 2-acrylamido-2-methylpmpanesulfonic acid and salts thereof; N-alkyl(meth)acrylamides such as methyl(meth) acrylamide, ethyl(meth)acrylamide, n-propyl(meth)acrylamide, isopropyl(meth)acrylamide, n-butyl(meth)acrylamide, and 2-ethylhexyl(meth)acrylamide; (di) alkylaminoalkylamides such as methylaminopropyl(meth) acrylamide, dimethylaminopropyl(meth)acrylamide, ethylaminopropyl(meth)acrylamide and diethylaminopropyl (meth)acrylamide; (di)alkylaminoalkyl(meth)acrylates such as methylaminoethyl(meth)acrylate, dimethylaminoethyl (meth)acrylate, ethylaminoethyl(meth)acrylate and diethylaminoethyl(meth)acrylate; aromatic vinyl compounds such as styrene, vinyl toluene and vinyl xylene; alkyl vinyl ethers having an alkyl group having 1 to 10 carbon atoms such as methyl vinyl ether, ethyl vinyl ether, n-propyl vinyl ether, isopropyl vinyl ether, n-butyl vinyl ether, isobutyl vinyl ether, t-butyl vinyl ether, n-hexyl vinyl ether, 2-ethylhexyl vinyl ether, n-octyl vinyl ether, n-nonyl vinyl ether and n-decyl vinyl ether, vinyl ester compounds such as vinyl formate, vinyl acetate, vinyl propionate, vinyl valerate, vinyl caprate, vinyl laurate, vinyl stearate, vinyl benzoate, vinyl pivalate and vinyl versatate; and α-olefins such as ethylene, propylene, and butylene. The other monomers can be used singly or in a combination of two or more.

The amount of the other monomers used in the morpholine polymer can be, for example, in a range of 0 mol % or more and 90 mol % or less, and may be in a range of 0 mol % or more and 50 mol % or less, 0 mol % or more and 30 mol % or less, 0 mol % or more and 20 mol % or less, or 0 mol % or more and 10 mol % or less. When the amount of the other monomers used exceeds 50 mol %, the amount of N-(meth)acryloylmorpholine used is less than 50 mol %, and therefore the balance of the adsorption property between the abrasive and the wafer is deteriorated and the surface of the object to be polished may not be finished smoothly.

A water-soluble polymer is commercially available or can be obtained by a known method, including the case in which the water-soluble polymer is a morpholine polymer. For example, the water-soluble polymer can be obtained by polymerizing monomers described above.

The polymerization method is not particularly limited, but a solution polymerization method is preferable because it enables to obtain a water-soluble polymer in a uniform state. It is preferable to obtain a water-soluble polymer by radically polymerizing monomers according to a solution polymerization method. Regarding a polymerization solvent for solution polymerization, any of water, an organic solvent, and a solvent mixture of water and an organic solvent can be used. Specific examples of organic solvents include methanol, ethanol, isopropanol, acetone, and methyl ethyl ketone. These can be used singly or in a combination of two or more. Generally, water, or a solvent mixture of water and an organic solvent can be preferably used. Particularly, an aqueous solution polymerization method using water as a polymerization solvent is preferably used.

The weight average molecular weight (Mw) of the water-soluble polymer is not particularly limited, including the case in which the compound is a morpholine polymer, and it may be, for example, in a range of 10,000 to 2,000,000. In some embodiments, the Mw of the water-soluble polymer may be, for example, 1,500,000 or less, 1,200,000 or less, or 800,000 or less. When the Mw of the water-soluble polymer is smaller, the water-soluble polymer is more likely to be removed by cleaning. In some embodiments, in order to improve protectivity, the Mw of the water-soluble polymer may be, for example, 50,000 or more, 100,000 or more, 200,000 or more, or 300,000 or more, and in some cases, may be 400,000 or more, or even 500,000 or more. An LPD reduction effect obtained by applying the art disclosed herein can be effectively exhibited even if such a water-soluble polymer having a relatively high Mw is used. The number average molecular weight (Mn) of the water-soluble polymer is, including the case in which the water-soluble polymer is a morpholine polymer, preferably in a range of 1,000 to 1,000,000, more preferably in a range of 1,500 to 60,000, and still more preferably in a range of 2,000 to 400,000. When the number average molecular weight (Mn) is 1,000 or more, sufficient surface protectivity of the wafer is secured, and when the Mn is 1,000,000 or less, the dispersibility of the abrasive can be secured. Herein, the weight average molecular weight and the number average molecular weight can be measured through gel permeation chromatography (GPC, for example, HLC-8220, available from Tosoh Corporation) in terms of polymethyl methacrylate.

The molecular weight distribution (PDI) of the water-soluble polymer is generally preferably narrow, including the case in which the compound is a morpholine polymer. Specifically, the value obtained by dividing the weight average molecular weight (Mw) by the number average molecular weight (Mn) is preferably 4.0 or less, more preferably 3.5 or less, and still more preferably 3.0 or less. When the molecular weight distribution (PDI) is 4.0 or less, sufficient surface protectivity can be exhibited, and it is possible to avoid an event that causes deterioration of dispersibility of the abrasive due to a high molecular weight material.

Although not particularly limited, the content (when two or more types are included, a total amount thereof) of the water-soluble polymer in the polishing composition can be, for example, 20 parts by weight or less, with respect to 100 parts by weight of the abrasive. In view of improving cleanability and a polishing removal rate, the content of the water-soluble polymer with respect to 100 parts by weight of the abrasive may be, for example, 10 parts by weight or less, 7 parts by weight or less, 5 parts by weight or less, 4 parts by weight or less, 3 parts by weight or less, or 2 parts by weight or less. In view of improving surface protectivity of the object to be polished, the content of the water-soluble polymer with respect to 100 parts by weight of the abrasive may be, for example, 0.01 parts by weight or more, and is generally appropriately 0.05 parts by weight or more, and may be 0.1 parts by weight or more, 0.5 parts by weight or more, or 1 part by weight or more.

(Polymerization Inhibitor)

A polymerization inhibitor may be added to monomers used for synthesizing a water-soluble polymer, in order to prevent an unintentional progress of a polymerization reaction during the production, transportation, storage, and the like of the monomers. The polymerization inhibitor is generally a compound that forms stable radicals by radicals generated in monomers and the like due to light, heat, or the like. Herein, the concept of the polymerization inhibitor in this specification also includes a compound called a polymerization retarder.

The polymerization inhibitor may be one or two or more selected from among known polymerization inhibitors. Examples include a compound represented by the following General Formula (1), a compound represented by the following General Formula (2), a phenothiazine compound, and a nitrosamine compound. A water-soluble polymer obtained by using monomers containing at least one compound selected from the group consisting of a compound represented by the following General Formula (1), a compound represented by the following General Formula (2), a phenothiazine compound, and a nitrosamine compound as raw materials can be preferably used as the water-soluble polymer contained in the polishing composition disclosed herein. In such a polishing composition, it is particularly significant to limit the content of the reaction product of the polymerization initiator and the polymerization inhibitor to 0.1 ppb or less of the polishing composition.

[C1]

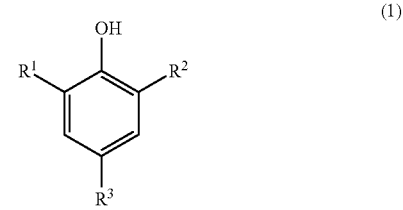

(1)

Wherein $R^1$ to $R^3$ each independently represent a hydrogen atom or a group selected from the group consisting of a hydroxy group, an alkyl group having 1 to 8 carbon atoms and an alkoxy group having 1 to 8 carbon atoms.

[C2]

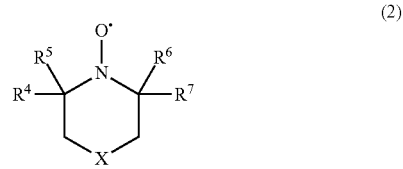

(2)

Wherein X represents $CH_2$, $CH(CH_2)_pOH$ wherein p is an integer of 0 to 3, $CHO(CH_2)_qOH$ wherein q is an integer of 0 to 3, $CHO(CH_2)_rCH_3$ wherein r is an integer of 0 to 2, CHCOOH, or C=O; and $R^4$, $R^5$, $R^6$ and $R^7$ each independently represent a group selected from among alkyl groups having 1 to 3 carbon atoms.

When $R^1$ to $R^3$ in General Formula (1) are an alkyl group or an alkoxy group, the alkyl group included in the alkyl group or alkoxy group may be linear or branched. The number of carbon atoms of the alkyl group or alkoxy group is preferably about 1 or more and 4 or less, and more preferably about 1 or more and 3 or less. $R^3$ preferably represents a hydroxy group.

Examples of compounds represented by General Formula (1) include methylhydroquinone, t-butylhydroquinone, hydroquinone, methoxyphenol, and the like, 4-tert-butyl pyrocatechol, 2,6-di-tert-butyl-p-cresol and the like.

Compounds represented by General Formula (2) are known piperidine-1-oxyls. Examples of groups that can be selected as $R^4$, $R^5$, $R^6$ and $R^7$ include a methyl group, an ethyl group, an n-propyl group, and an isopropyl group. Examples of compounds represented by General Formula (2) include 2,2,6,6-tetramethylpiperidine 1-oxyl, 2,2,6,6-tetraethylpiperidine 1-oxyl, 2,2,6,6-tetra-n-propylpiperidine 1-oxyl and derivatives thereof.

Examples of phenothiazine compounds include phenothiazine. Examples of nitrosamine compounds include ammonium N-nitrosophenylhydroxylamine, and N-nitrosophenylhydroxylamine aluminum salts.

The amount of the polymerization inhibitor used is not particularly limited, and can be, for example, about 0.005 wt % (50 ppm) or more and 0.5 wt % (5,000 ppm) or less, and preferably 0.01 wt % (100 ppm) or more and 0.3 wt % (3,000 ppm) or less with respect to the total weight of all monomers constituting the whole water-soluble polymer or the weight of the water-soluble polymer.

(Polymerization Initiator)

The polymerization is typically performed in the presence of a polymerization initiator. The polymerization initiator is not particularly limited, and commonly used polymerization initiators can be used. In particular, a radical polymerization initiator is preferably used.

As the radical polymerization initiator, one or two or more known radical polymerization initiators can be appropriately selected and used. Examples thereof include persulfates such as sodium persulfate, potassium persulfate and ammonium persulfate, hydroperoxides such as t-butyl hydroperoxide, water-soluble peroxides such as hydrogen peroxide, ketone peroxides such as methyl ethyl ketone peroxide, and cyclohexanone peroxide, dialkyl peroxides such as di-t-butyl peroxide and t-butylcumyl peroxide, oil-soluble peroxides of peroxyesters such as t-butyl peroxypivalate and t-hexyl peroxypivalate, water-soluble azo compounds such as 2,2'-azobis[N-(2-carboxyethyl)-2-methylpropionamidine]hydrate, 2,2'-azobis[2-(2-imidazolin-2-yl)propane], 2,2'-azobis[2-(2-imidazolin-2-yl)propane]dihydrochloride, 2,2'-azobis[2-(2-imidazolin-2-yl)propane]disulfate dihydrate, 22-azobis(2-amidinopropane)dihydrochloride, 2,2'-azobis[2-methyl-N-(2-hydroxyethyl)propionamide], 2,2'-azobis(N-butyl-2-methylpropionamide), 2,2'-azobis[N-(2-propenyl)-2-methylpropionamide] and 4,4'-azobis-4-cyanovaleric acid, and oil-soluble azo compounds such as 2,2'-azobisisobutyronitrile, 2,2'-azobis(2,4-dimethylvaleronitrile), and 2.2'-azobis(2-methylbutyronitrile).

Among these polymerization initiators, in view of easy control of a polymerization reaction, a water-soluble polymerization initiator such as persulfates and a water-soluble azo compound can be preferably used. A polymerization initiator which is a water-soluble azo compound is particularly preferable. The art disclosed herein can be preferably applied to a polishing composition containing a water-soluble polymer obtained by using a water-soluble azo compound as a polymerization initiator. In such a polishing composition, it is particularly significant to limit the content of the reaction product of the polymerization initiator and the polymerization inhibitor to 0.1 ppb or less of the polishing composition.

The amount of the polymerization initiator used is not particularly limited, and, for example, preferably a proportion of 0.1 to 10 wt %, more preferably a proportion of 0.1 to 5 wt %, and still more preferably a proportion of 0.2 to 3 wt % of the amount thereof is used with respect to the total weight of monomers used for synthesis of the water-soluble polymer or the weight of the water-soluble polymer.

In synthesizing a water-soluble polymer, as needed, a chain transfer agent can be used. With the use of a chain transfer agent, the molecular weight of the water-soluble polymer can be appropriately adjusted. Known chain transfer agents can be used, and examples thereof include mercaptoacetic acid, mercaptopropionic acid, and 2-mercaptoethanol in addition to alkyl thiol compounds having an alkyl group having 2 to 20 carbon atoms such as ethanethiol, 1-propanethiol, 2-propanethiol, 1-butanethiol, 2-butanethiol, 1-hexanethiol, 2-hexanethiol, 2-methylheptane-2-thiol, 2-butylbutane-1-thiol, 1,1-dimethyl-1-pentanethiol, 1-octanethiol, 2-octanethiol, 1-decanethiol, 3-decanethiol, I-undecanethiol, 1-dodecanethiol, 2-dodecanethiol, 1-tridecanethiol, 1-tetradecanethiol, 3-methyl-3-undecanethiol, 5-ethyl-5-decanethiol, tert-tetradecanethiol, 1-hexadecanethiol, 1-heptadecanethiol and 1-octadecanethiol. These can be used singly or in a combination of two or more.

The reaction temperature (polymerization temperature) at which a water-soluble polymer is synthesized from monomers is preferably 30° C. to 100° C., more preferably 40° C. to 90° C., and still more preferably 50° C. to 80° C. In view of suppressing generation of the reaction product of the polymerization initiator and the polymerization inhibitor, synthesis of the water-soluble polymer is preferably performed under a non-oxygen atmosphere and, for example, it is preferably performed under an inert gas such as nitrogen gas.

(Reaction Product of Polymerization Initiator and Polymerization Inhibitor)

In the polishing composition disclosed herein, the content of the reaction product of the polymerization initiator and the polymerization inhibitor is 0.1 ppb or less with respect to the polishing composition.

In a system in which a polymerization initiator and a polymerization inhibitor coexist, in the presence of oxygen, the reaction product of the polymerization initiator and the polymerization inhibitor is generated from radicals derived from the polymerization initiator. For example, one reaction scheme is shown below. The following scheme 1 is an inference and example, and is not intended to limit the disclosure of this specification, and shows an example in which the polymerization initiator is 2,2'-azobis[2-(2-imidazolin-2-yl)propane]disulfate dehydrate which is one of radical polymerization initiators and the polymerization inhibitor is MQ (hydroquinone monomethyl ether). From a combination of the polymerization initiator and the polymerization inhibitor, in the presence of oxygen, for example, it is thought that the following compound a is generated as the reaction product.

[C3]

Scheme 1

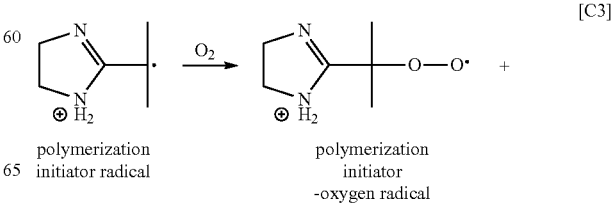

[C3]

polymerization initiator radical polymerization initiator -oxygen radical

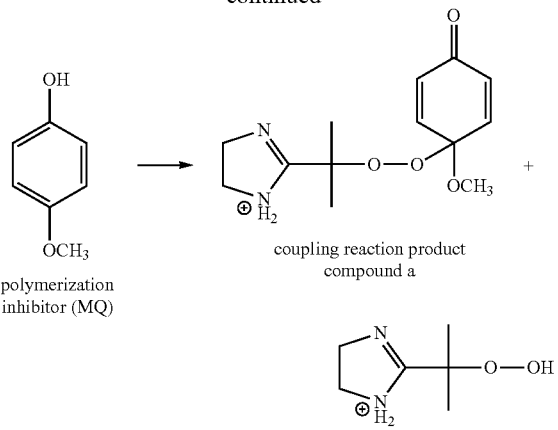

In the scheme 1, radicals derived from the polymerization initiator are generated. For example, in the presence of oxygen, radicals of the polymerization initiator may react with oxygen to generate polymerization initiator-oxygen radicals. Such radicals can extract protons from the polymerization inhibitor to generate polymerization inhibitor radicals. It is thought that the polymerization inhibitor radicals couple with polymerization initiator-oxygen radicals or polymerization initiator radicals to generate the compound a as a coupling reaction product at a molar ratio of 1:1.

Radicals of the polymerization initiator and radicals of the polymerization inhibitor can cause various other reactions. For example, polymerization inhibitor radicals react with other polymerization inhibitors in a chain reaction to generate a chain reaction product of the polymerization inhibitor.

In this manner, the reaction product may include various reaction products such as a coupling reaction product of a polymerization initiator and a polymerization inhibitor and a chain reaction product of a polymerization inhibitor. Accordingly, the reaction product can be a mixture of a wide variety of compounds. In one embodiment of the art disclosed herein, the compound can be a reaction product in which a polymerization initiator and a polymerization inhibitor are coupled via oxygen. The compound a is exemplified as the coupled reaction product. In one embodiment of the art disclosed herein, measurement of the amount of the reaction product can be replaced by measurement of the amount of the compound a. The amount of the compound a can be measured through liquid chromatography (LC) or the like. It can also be calculated from the amounts of the initiator and the inhibitor reduced with respect to the initial amounts.

It is thought that the reaction product includes the above-described reaction products derived from the polymerization initiator and the polymerization inhibitor. Such a reaction product includes a structure derived from a polymerization inhibitor. Therefore, for example, generally, it is thought to be a hydrophobic compound having an aromatic ring derived from a polymerization inhibitor or a hydrophobic moiety derived from a heterocyclic amine. It is thought that this reaction product constitutes a solute part having relatively high hydrophobicity in a polishing composition containing water and a water-soluble polymer. The highly hydrophobic reaction product is likely to be adsorbed on the surface of an object to be polished such as a wafer whose surface is hydrophobic. Therefore, this reaction product is not removed by cleaning after polishing but is likely to remain on the surface of the object to be polished, and as a result, it can be detected as LPDs.

According to the an disclosed herein, by suppressing the amount of the reaction product with respect to the polishing composition to 0.1 ppb or less, it is possible to effectively reduce LPDs caused by adsorption of the reaction product to the surface of the object to be polished. In view of improving the LPDs reduction effect, in some embodiments, the amount of the reaction product may be, for example, 0.05 ppb or less, 0.02 ppb or less, or 0.01 ppb or less. In consideration of handling properties of monomers used as a raw material of the water-soluble polymer, productivity and handling properties of the water-soluble polymer, and productivity of the polishing composition, and the like, in some embodiments, the polishing composition includes the reaction product. The amount of the reaction product may be 0.001 ppb or more or 0.005 ppb or more.

The amount of the reaction product contained in a polishing composition can be adjusted by, for example, the amount of the reaction product that the water-soluble polymer used for preparing the polishing composition contains. The amount of the reaction product with respect to the water-soluble polymer may vary depending on the type and amount of the polymerization inhibitor contained in the monomers used for synthesis of the water-soluble polymer, the type of the polymerization initiator and the amount of the polymerization initiator used with respect to monomers, the concentration of the polymerization inhibitor and the polymerization initiator in a mixture in which the polymerization inhibitor and the polymerization initiator coexist, a time for which the coexisting state continues and the temperature of the mixture during the time, the amount of oxygen contained in the mixture or in contact with the mixture, or the like. For example, the amount of the reaction product with respect to the water-soluble polymer tends to be reduced by reducing the amount of a polymerization initiator used, using a polymerization initiator with a higher decomposition rate, using monomers with a lower content of a polymerization inhibitor or monomers that have been subjected to a purification treatment for removing a part or all of the polymerization inhibitor immediately before use, synthesis of a water-soluble polymer at a lower concentration (that is, using a large amount of a polymerization solvent), synthesis of a water-soluble polymer which more strictly excludes the incorporation of oxygen and contact with oxygen, reducing a polymerization temperature, shortening a polymerization time, by performing a treatment for decomposing the polymerization initiator remaining after polymerization by heating and/or elapse of time, or purifying a water-soluble polymer by reprecipitation or the like. Those skilled in the art can reduce the amount of the reaction product with respect to the water-soluble polymer without an excessive burden by appropriately using one or two or more methods including these exemplified methods. Thus, a polishing composition in which the amount of the reaction product with respect to the polishing composition is 0.1 ppb or less or within a preferable range disclosed herein can be obtained without an excessive burden.

A coupling reaction product in which the molar ratio between the polymerization initiator and the polymerization inhibitor is 1:1 can be detected by performing liquid chromatography based on liquid chromatography of a polymerization inhibitor to be described below, and also the concentration of the coupling reaction product can be quantified.

In addition, including the coupling reaction product, the concentration of the reaction product can be acquired as an estimated amount using the amount of the polymerization inhibitor reduced before and after the reaction, that is, a difference between the concentration before the reaction and the concentration after the reaction. More specifically, the amount of the reaction product generated is estimated by estimating that the amount of the polymerization inhibitor decreased is completely consumed by the coupling reaction between the polymerization initiator and the polymerization inhibitor at a ratio of 1:1. For example, the concentration of the reaction product with respect to the water-soluble polymer is estimated from the concentration of the polymerization inhibitor contained in the water-soluble polymer before and after the reaction with the polymerization initiator as follows.

> Concentration of the reaction product with respect to water-soluble polymer=(concentration of polymerization inhibitor with respect to water-soluble polymer before reaction−concentration of the polymerization inhibitor after reaction)×estimated molecular weight of the coupling reaction product/molecular weight of polymerization inhibitor.

For example, in the above scheme 1, the molecular weight of the polymerization inhibitor is 128, and the molecular weight of the coupling reaction product obtained by the reaction between the polymerization initiator and the polymerization inhibitor at a molar ratio of 1:1 is 383. The concentration and amount of the generated reaction product can be estimated based on such molecular weight information and the amount of the polymerization inhibitor decreased. Here, those skilled in the art can understand a coupling reaction product including the polymerization initiator and the polymerization inhibitor at a molar ratio of 1;1 from respective structures of the polymerization initiator and the polymerization inhibitor based on the scheme 1 and common technical knowledge and can calculate its molecular weight.

In addition, for example, from a combination of ammonium persulfate as the polymerization initiator and MQ (hydroquinone monomethyl ether) as the polymerization inhibitor, the following one coupling reaction product is estimated according to the following scheme 2.

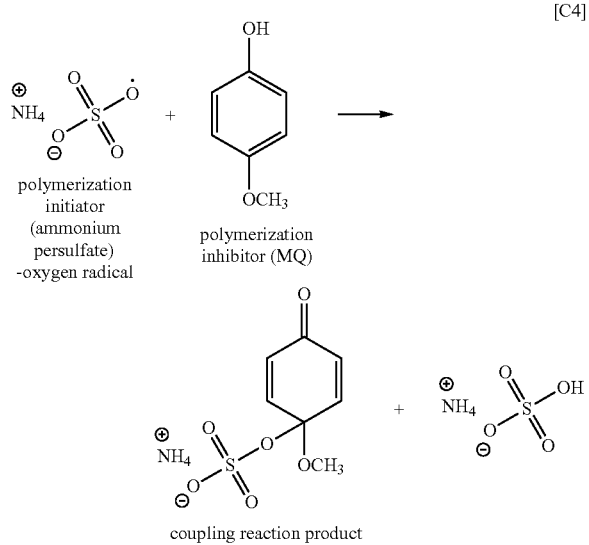

In addition, for example, from a combination of 2,2'-azobis[2-(2-imidazolin-2-yl)propane]disulfate dihydrate) as a polymerization initiator and phenothiazine as a polymerization inhibitor, the following one coupling reaction product will be estimated.

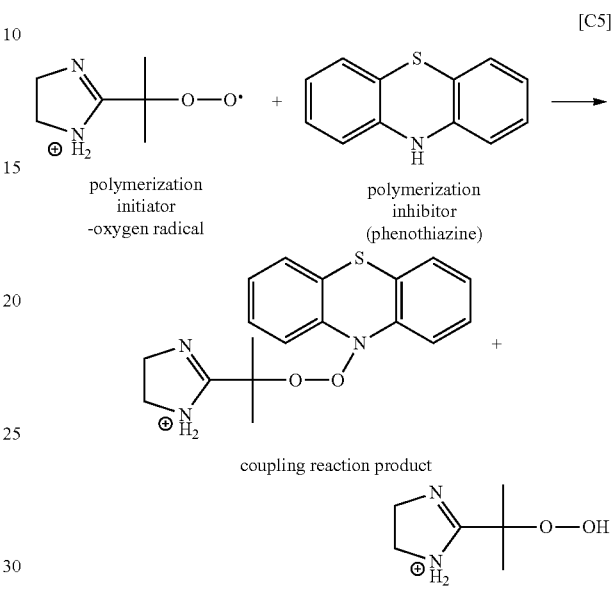

In addition, it has been found that the water-soluble polymer is colored from light yellow to yellowish brown depending on the content of the reaction product with respect to the water-soluble polymer. For example, the concentration of the reaction product can be estimated using such a degree of coloring obtained by measuring a yellowness index (YI) as an index. For example, YI can be obtained by performing measurement on an aqueous solution in which the solid content of the water-soluble polymer is adjusted to 20 wt % using OME-2000 (available from Nippon Denshoku Industries Co., Ltd.) or a device capable of measuring YI with the same precision and accuracy according to JIS K 7373.

Basic Compound

The basic compound is not particularly limited, and various known basic compounds used as polishing compositions for object to be polished such as wafers can be used. Such a basic compound may be any water-soluble basic compound, and one or two or more selected from among known inorganic basic compounds and organic basic compounds can be appropriately selected and used.

Examples of inorganic basic compounds include ammonia, and hydroxides, carbonates, and bicarbonates of alkali metals and alkaline earth metals. Examples of hydroxides include potassium hydroxide, sodium hydroxide, rubidium hydroxide and cesium hydroxide. Examples of carbonates and bicarbonates include ammonium bicarbonate, ammonium carbonate, potassium bicarbonate, potassium carbonate, sodium bicarbonate, and sodium carbonate.

Examples of organic basic compounds include amines, ammonia, and quaternary ammonium hydroxide salts. Examples of amines include triethylamine, monoethanolamine, diethanolamine, triethanolamine, diisopropanolamine, ethylenediamine, hexamethylenediamine, diethylenetriamine, triethylpentamine and tetraethylpentamine.

Examples of quaternary ammonium hydroxide salts include tetramethylammonium hydroxide, tetraethylammonium hydroxide and tetrabutylammonium hydroxide. For example, in view of low contamination on a semiconductor substrate, ammonia and/or quaternary ammonium hydroxide salts can be preferably used. The content of the basic compound in the composition is appropriately set. With the addition of such a basic compound or the like, the composition disclosed herein preferably has a pH of 8 to 13, at least at a time the composition is subjected to a polishing process. The range of pH is more preferably adjusted to 8.5 to 12, and still more preferably adjusted to 9.5 to 11.0.

Water

Regarding water in the composition, ion exchange water (deionized water), pure water, ultrapure water, distilled water, or the like can be preferably used. In order to avoid impairing the effect of other components contained in the polishing composition as much as possible, for example, the total content of transition metal ions in the water to be used is preferably 100 ppb or less For example, the purity of water can be improved by operations such as removal of impurity ions using an ion exchange resin, removal of contaminants using a filter, and distillation. As will be described below, the composition disclosed herein may further contain as needed an organic solvent (lower alcohol, lower ketone, etc.) that can be uniformly mixed with water. Generally, preferably 90 volume % or more of the solvent contained in the polishing composition is water, and more preferably 95 volume % or more (typically 99 to 100 volume %) thereof is water.

Other Components

In addition, the composition can appropriately include, as optional components, known additives that can be used in the polishing composition. Examples include various chelating agents, surfactants, preservatives, and antifungal agents in addition to the organic solvents described above. The chelating agent has a function of forming complex ions with metal impurities that can be contained in the polishing composition and capturing them and thus suppressing contamination of an object to be polished due to metal impurities. As the chelating agent, known chelating agents can be used singly or in a combination of two or more. The surfactant is not particularly limited, for example, one or two or more selected from among known anionic or nonionic surfactants can be appropriately selected and used.

Preferably, the composition disclosed herein is substantially free of an oxidizing agent. In case an oxidizing agent is contained, for example, the surface of the object to be polished such as a wafer is oxidized to form an oxide layer with the supply of this composition, and thereby the polishing removal rate can decrease. Specific examples of oxidizing agents include hydrogen peroxide ($H_2O_2$), sodium persulfate, ammonium persulfate, and sodium dichloroisocyanurate. Herein, when it is stated that the composition is substantially free of an oxidizing agent, it means that an oxidizing agent is not contained at least intentionally.

The form of the composition is not particularly limited. For example, the composition may be in a form of a polishing liquid (working slurry) that is supplied to an object to be polished in a polishing process as is. In addition, the composition may be in a form of a polishing stock solution that is generally diluted with water or a liquid mixture of water and an organic solvent at the time of use. The polishing stock solution can be understood as a concentrate of a working slurry. In addition, the composition may be in a form of a kit in which the components constituting the composition are mixed at the time of use. That is, the composition may be in a form of a kit in which a plurality of agents each contains one or two or more components among a water-soluble polymer, a reaction product, an abrasive and a basic compound are combined. As will be described below, one agent among the plurality of agents may be a polymer composition containing a water-soluble polymer. The kit can further include one or two or more optional components in addition to water.

The pH of the polishing liquid is preferably adjusted to, for example, about 8 or more 13 or less. For example, the pH is preferably 8.5 or more or 9.0 or more, and more preferably 9.5 or more or 10.0 or more. The pH is, for example, preferably 12.5 or less or 12.0 or less, and more preferably 11.5 or less or 11.0 or less.

The composition can be produced by, for example, a method including preparing a polymer composition which includes the water-soluble polymer and in which the content of the reaction product is 0.1 ppb or less of the polishing composition, and mixing the polymer composition, the abrasive, and the basic compound. The polymer composition may be a composition in a form in which a water-soluble polymer is dissolved in water, that is, an aqueous solution of a water-soluble polymer. As the polymer composition, for example, a polymerization reaction liquid obtained from the synthesis of a water-soluble polymer, or those obtained by subjecting one or more treatments such as dilution, concentration, drying, neutralization, and adding optional components on the polymerization reaction liquid can be used. Alternatively, those obtained by purifying a water-soluble polymer contained in the polymerization reaction liquid using known methods such as filtration, adsorption, and reprecipitation may be used as the polymer composition.

When components are mixed to provide the composition, the mixing order and the mixing method are not particularly limited. The components may be independently mixed in any order, or two or more components may be appropriately mixed in advance and all components may be then mixed. The mixing method is not particularly limited, and known mixing devices, for example, well-known mixing devices such as a wing type stirrer, an ultrasonic dispersing machine, and a homo mixer can be used.

Applications

The composition disclosed herein can be applied for polishing of objects to be polished having various materials and shapes. Examples of materials of objects to be polished include metals or metalloids such as silicon, aluminum, nickel, tungsten, copper, tantalum, titanium, and stainless steel, or alloys thereof: glassy materials such as quartz glass, aluminosilicate glass, glassy carbon, or the like; ceramics such as alumina, silica, sapphire, silicon nitride, tantalum nitride, and titanium carbide; compound semiconductor substrate materials such as silicon carbide, gallium nitride, and gallium arsenide; resin materials such as a polyimide resin; and the like. An object to be polished may be formed of a plurality of materials among these.

The composition disclosed herein can be particularly preferably used for polishing a surface made of silicon such as silicon substrate. A typical example of the silicon substrate here is a single crystal silicon wafer, and is, for example, a single crystal silicon wafer obtained by slicing a single crystal silicon ingot.

The composition disclosed herein can be preferably applied to a polishing step of an object to be polished, for example, a polishing step of a silicon wafer. Before a polishing step using this composition, a general treatment that can be applied to an object to be polished in a step upstream from the polishing step such as lapping and etching can be applied to the object to be polished.

The composition disclosed herein can be preferably used for, for example, polishing of an object to be polished whose surface is adjusted to a surface roughness of 0.01 nm to 100 nm in the upstream step, for example, polishing a wafer. The surface roughness Ra of the object to be polished can be measured using, for example, a laser scan surface roughness meter "TMS-3000WRC" available from Schmitt Measurement System Inc. Use in final polishing (finish polishing) or polishing immediately therebefore is effective, and use in final polishing is particularly preferable. Herein, the final polishing refers to the last polishing step in a process of producing an object, that is, a step in which no additional polishing is performed after that step.

Polishing

The composition disclosed herein can be used for polishing an object to be polished, for example, in an embodiment including the following operations. Hereinafter, a preferable embodiment of a method for polishing an object to be polished using this composition, for example, a silicon wafer, will be described.

That is, a polishing liquid containing any of the polishing compositions disclosed herein is prepared. Preparing of the polishing liquid may include preparing a polishing liquid by performing operations such as adjustment of a concentration such as dilution and adjustment of the pH on the polishing composition. Alternatively, the polishing composition may be directly used as a polishing liquid.

Next, the polishing liquid is supplied to an object to be polished and the object is polished by a general method. For example, when final polishing is performed on a silicon wafer, typically, a silicon wafer having undergone a lapping step is set in a general polishing machine, and a polishing liquid is supplied to a surface to be polished of the silicon wafer through a polishing pad of the polishing machine. Typically, while the polishing liquid is continuously supplied, the polishing pad is pressed against a surface to be polished of the silicon wafer, and they are moved relatively, for example, rotated. Polishing of the object to be polished is completed through such a polishing step.

The polishing pad used in the polishing step is not particularly limited. For example, polyurethane foam type, non-woven fabric type, and suede type polishing pads can be used. The polishing pads may or may not contain an abrasive. Generally, a polishing pad containing no abrasive is preferably used.

Matters disclosed herein include the followings.

[1] A polishing composition including:
an abrasive;
a water-soluble polymer; and
a basic compound,
wherein a content of a reaction product of a polymerization initiator and a polymerization inhibitor is 0.1 ppb or less of the polishing composition on a weight basis.

[2] The polishing composition according to [1] above, wherein the polymerization inhibitor includes at least one compound selected from the group consisting of a compound represented by the following General Formula (1), a compound represented by the following General Formula (2), a phenothiazine compound, and a nitrosamine compound:

[C6]

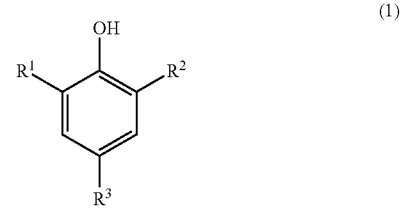

(1)

wherein $R^1$ to $R^3$ each independently represent a hydrogen atom or a group selected from the group consisting of a hydroxy group, an alkyl group having 1 to 8 carbon atoms and an alkoxy group having 1 to 8 carbon atoms,

[C7]

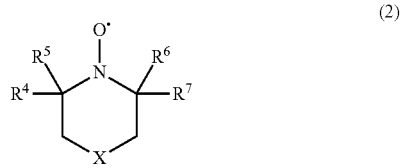

(2)

wherein X represents $CH_2$, $CH(CH_2)_pOH$ wherein p is an integer of 0 to 3, $CHO(CH_2)_qOH$ wherein q is an integer of 0 to 3, $CHO(CH)_rCH_3$ wherein r is an integer of 0 to 2, CHCOOH, or C=O; and $R^4$, $R^5$, $R^6$ and $R^7$ each independently represent a group selected from among alkyl groups having 1 to 3 carbon atoms.

[3] The polishing composition according to [1] or [2] above, wherein the water-soluble polymer contains 10 mol % or more and 100 mol % or less of a structural unit derived from a monomer containing a nitrogen atom.

[4] The polishing composition according to any of [1] to [3] above, used for polishing a silicon wafer.

[5] A method for producing the polishing composition according to any of [1] to [4] above, the method including:
preparing a polymer raw material containing the water-soluble polymer, wherein a content of the reaction product in the polymer raw material is 0.1 ppb or less with respect to the polishing composition on a weight basis; and
mixing the polymer raw material, the abrasive, and the basic compound.

EXAMPLES

Several Examples relating to the present invention are described below although the present invention is not to be limited to such Examples. Hereinafter, unless otherwise specified. "parts" and "%" refer to "parts by weight" and "% by weight." A method for analyzing water-soluble polymers obtained in production examples, water-soluble polymers (hereinafter simply referred to as a polymer) in examples and comparative examples, and a method for evaluating a polishing composition will be described below.

(1) Measurement of Molecular Weight

The molecular weight of each polymer was measured through gel permeation chromatography (GPC) under the following conditions, and determined as a weight average molecular weight (Mw) in terms of polymethyl methacrylate.

[Measurement Conditions]
Device: HLC-8320GPC (available from Tosoh Corporation)
Column: TSKgel SuperHM-Mx3 columns (available from Tosoh Corporation)
Solvent: N,N-dimethylformamide (containing 10 mM LiBr)
Temperature: 40° C.
Detector: RI
Flow rate: 300 μL/min (2) Measurement of Amount of Polymerization Inhibitor and Estimation of Amount of Reaction Product 15 mg of the polymer obtained in the production example was collected in a 2 mL micro tube, 1 mL of methanol was added thereto, and the mixture was stirred using a shaker for 30 min. Then, a supernatant liquid was collected using a centrifuge (12,000×5 min), and measurement was performed through liquid chromatography (LC) under the following conditions. The amount of the polymerization inhibitor contained in the polymer was calculated from a peak area derived from the polymerization inhibitor.

[Measurement Conditions]
Device: LC-20AC+SPD-M20A (available from Shimadzu Corporation)
Column: Inertsil ODS-3 (available from GL Sciences Inc.)
Solvent: water/methanol=45/55 wt % (constant gradient)
Temperature: 40° C.
Detection wavelength: 290 nm
Flow rate: 300 μL/min N-acryloylmorpholine used in the production examples contained 1,000 ppm of MQ (methoxyphenol, molecular weight of 128) as the polymerization inhibitor with respect to monomers. A radical coupling reaction product including radicals of 2.2'-azobis[2-(2-imidazolin-2-yl)propane]disulfate dehydrate (VA-046B available from Wako Pure Chemical Industries. Ltd) as the polymerization initiator and radicals of MQ at a ratio of 1/1 was estimated as follows, and its molecular weight was set to 383, and the amount of the reaction product was calculated.

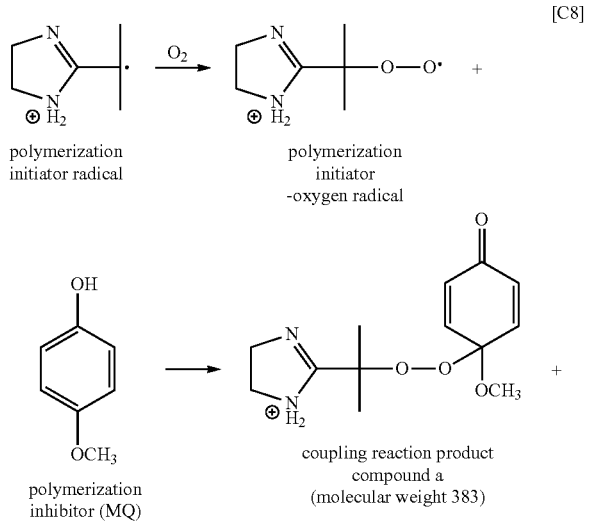

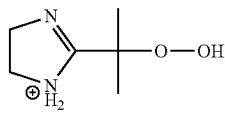

Production of Polymer

Production Example 1

Pure water (390 g) was put into a 1 L flask equipped with a stirrer, a reflux cooling pipe, a thermometer and a nitrogen (or 5% oxygen (based on volume)) inlet pipe. While bubbling nitrogen gas blown into the pure water from the nitrogen inlet pipe (100 ml/min), the system was heated to 90° C. and stirred at the same temperature for 30 minutes. Thereby, oxygen dissolved in the pure water was removed. Next, while continuing nitrogen bubbling, the system was cooled to 60° C., and 2,2'-azobis[2-(2-imidazolin-2-yl)propane]disulfate dehydrate (VA-046B, available from Wako Pure Chemical Industries, Ltd., 0.35 g) was added thereto. Here, N-acryloylmorpholine (ACMO, available from KJ Chemicals Corporation, 100 g) was added dropwise thereto over 3 hours and polymerized. After dropwise addition as completed, stirring was performed at 60° C. while additionally continuing nitrogen bubbling for 1 hour. The system was then heated to 80° C. and stirred for 2.5 hours while performing nitrogen bubbling, thereby the remaining polymerization initiator was decomposed under a non-oxygen atmosphere to reduce the amount thereof. Then, nitrogen bubbling was stopped, the system was opened, and was cooled to room temperature. Then, switched to 5% oxygen bubbling (50 ml/min), an initiator treatment in which stirring for 30 days under an internal temperature adjusted to 40 C was performed. A polymerization reaction liquid A as a polymer A aqueous solution was thus obtained.

Here, 4 hours after (that is, immediately before the system was heated to 80° C.) from when dropwise addition of ACMO started, a part of the reaction liquid was taken out and analyzed, and it was confirmed that the polymerization conversion of ACMO at that time was about 100%. In this reaction liquid, with respect to the amount of ACMO used, the amount of the polymerization inhibitor was 1.000 ppm before the initiator treatment, and 999.90 ppm after the initiator treatment, and the amount of the compound a estimated from the amount of the polymerization inhibitor reduced (0.10 ppm) was 0.30 ppm with respect to the amount of ACMO used.

Production Example 2

A polymerization reaction liquid B as a polymer B aqueous solution was obtained in the same manner as in Production Example 1 except that the amount of the polymerization initiator used was changed to 0.15 g in Production Example 1. The amount of the polymerization inhibitor reduced was 0.04 ppm, and the amount of compound a estimated from the amount of the polymerization inhibitor reduced was 0.13 ppm with respect to the amount of ACMO used.

200 g of a liquid in Production Example 1 which is after polymerization and immediately after stirring under nitrogen bubbling at 80° C. for 2.5 hours (i.e., the liquid before the initiator treatment), 0.24 g of the polymerization initiator (VA-046B), 0.392 g of the polymerization inhibitor (MQ), and 10 g of water were mixed and the mixture was heated and stirred at 50° C. for 3 days. The liquid obtained from the above operation was referred to as a "stock liquid."

The amount of the polymerization inhibitor in the stock liquid with respect to ACMO was 9607.2 ppm before heating and stirring, and 8080.4 ppm after heating and stirring, and the amount of compound a estimated from the amount of the polymerization inhibitor reduced was 4,700 ppm with respect to the amount of ACMO used.

Preparation of Polishing Liquid

Example 1

The polymerization reaction liquid A was mixed with an abrasive, ammonia water (concentration of 29%) and deionized water to obtain a polishing composition concentrate. The concentrate was diluted by a factor of 20 with deionized water to prepare a polishing liquid (working slurry).

Here, as the abrasive, colloidal silica having an average primary particle size of 35 nm and an average secondary particle size of 60 nm was used. The average primary particle size was measured using a surface area measuring device (product name "Flow Sorb II 2300" available from Micromeritics Instrument Corporation). The average secondary particle size was a volume average particle size based on a dynamic light scattering method measured using a model "UPA-UT151" (available from Nikkiso Co., Ltd.).

Regarding the used amounts of the abrasive, polymerization reaction liquid A and ammonia water, the content of the abrasive in the polishing liquid was 0.46%, the content of the polymer A was 0.0075%, and the content of ammonia was 0.01%.

Example 2

A polishing liquid according to Example 2 was prepared in the same manner as in Example 1 except that the polymerization reaction liquid B was used in place of the polymerization reaction liquid A in Example 1.

Comparative Examples 1 and 2

Polishing liquids according to Comparative Examples 1 and 2 were prepared in the same manner as in Example 1 except that liquids obtained by mixing the polymerization reaction liquid A and the stock liquid at ratios shown in Table 1 were used in place of the polymerization reaction liquid A in Example 1.

Polishing Test (Polishing of Silicon Wafer)

Using the polishing liquids according to respective examples, a silicon wafer was polished under the following conditions. As the silicon wafer, those obtained by preliminary polishing a lapped and etched commercial silicon single crystal wafer (P-type conductivity, crystal orientation: <100>, resistivity: 1 Ω·cm or more and less than 100 Ω·cm, COP free) with a diameter of 200 mm to adjust the surface roughness to 0.1 nm to 10 nm was used. For the preliminary polishing, a preliminary polishing slurry containing 0.95% of colloidal silica having an average primary particle size of 35 nm and 0.065% of potassium hydroxide in water was used.

[Polishing Conditions]

Polishing machine: single wafer polishing machine, model "PNX-332B" (available from Okamoto Machine Tool Works. Ltd.)

Polishing table: the first and second stages of final polishing after preliminary polishing were performed using the latter two tables among three tables of the polishing machine. (The following conditions were the same for the tables)

Polishing pressure: 15 kPa
Platen rotational speed: 30 rpm
Head rotational speed: 30 rpm
Polishing time: 2 minutes
Temperature of polishing liquid: 20° C.
Flow rate of polishing liquid: 2.0 L/min (one-way)

(Cleaning)

The silicon wafer after polishing was cleaned using a cleaning solution containing $NH_4OH$ (29%):$H_2O_2$ (31%): deionized water (DIW)=1:3:30 (volume ratio) (SC-1 cleaning). More specifically, two cleaning baths equipped with an ultrasonic wave oscillator of 950 kHz frequency were prepared, the cleaning solution was placed in each of the first and second cleaning baths and maintained at 60° C., the silicon wafer after polishing was immersed in the first cleaning bath for 6 minutes, passed through a rinse bath with ultrapure water and ultrasonic waves, and immersed in the second cleaning bath for 6 minutes while the ultrasonic wave oscillators were turned on.

(Evaluation of LPDs)

The number of defects with a size of 61 nm or more present on the surface of the silicon wafer after cleaning was counted using a wafer defect tester (product name "Surfscan SP2XP" available from KLA-Tencor). The result was converted into a relative value with respect to 100% of Comparative Example 1, and evaluated according to the following three-grade scale. The results are shown in Table 1.

I: Relative value with respect to Comparative Example 1 was 90% or less
II: Relative value with respect to Comparative Example 1 was more than 90% and 120% or less
III: Relative value with respect to Comparative Example 1 was more than 120%

TABLE 1

| | Polymer (Mw) | Composition | Content of reaction product [ppb] | LPDs |
|---|---|---|---|---|
| Example 1 | A (325,000) | Polymerization reaction liquid A | 0.02 | I |
| Example 2 | B (560,000) | Polymerization reaction liquid B | 0.01 | I |
| Comparative Example 1 | A (325,000) | Polymerization reaction liquid A:stock liquid = 99.92%:0.080% | 0.29 | II |
| Comparative Example 2 | A (325,000) | Polymerization reaction liquid A:stock liquid = 99.61%:0.39% | 1.33 | III |

As shown in Table 1, it was confirmed that LPDs were significantly reduced in Examples 1 and 2 in which the amount of the reaction product with respect to the polishing composition was 0.1 ppb or less compared to Comparative Examples 1 and 2 in which the amount of the reaction product was more than 0.1 ppb.

While specific examples of the present invention have been described above in detail, these are only examples, and do not limit the scope of the claims. The technologies described in the scope of the claims include various modifications and alternations of the specific examples exemplified above.

The invention claimed is:

1. A polishing composition comprising:
   an abrasive;
   a water-soluble polymer;
   a basic compound; and
   a reaction product of a polymerization initiator and a polymerization inhibitor, wherein:
   the polymerization initiator is a radical polymerization initiator, wherein the radical polymerization initiator is one or two or more selected from the group consisting of persulfates, water-soluble peroxides, oil-soluble peroxides, water-soluble azo compounds, and oil-soluble azo compounds; and
   wherein the reaction product of the polymerization initiator and the polymerization inhibitor is a coupling reaction product of the polymerization initiator and the polymerization inhibitor;
   wherein a content of the reaction product of the polymerization initiator and the polymerization inhibitor is 0.1 ppb or less of the polishing composition on a weight basis, and
   the water-soluble polymer contains 10 mol % or more and 100 mol % or less of a structural unit derived from a monomer containing a nitrogen atom.

2. The polishing composition according to claim 1, wherein the polymerization inhibitor includes at least one compound selected from the group consisting of a compound represented by the following General Formula (1), a compound represented by the following General Formula (2), a phenothiazine compound, and a nitrosamine compound:

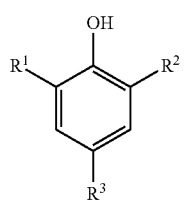
(1)

wherein $R^1$ and $R^2$ each independently represent a hydrogen atom or a group selected from the group consisting of a hydroxy group, an alkyl group having 1 to 8 carbon atoms and an alkoxy group having 1 to 8 carbon atoms, and $R^3$ represents a group selected from the group consisting of an alkyl group having 1 to 8 carbon atoms and an alkoxy group having 1 to 8 carbon atoms;

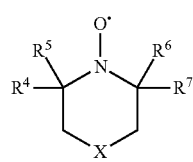
(2)

wherein X represents $CH_2$, $CH(CH_2)_pOH$ wherein p is an integer of 0 to 3, $CHO(CH_2)_qOH$ wherein q is an integer of 0 to 3, $CHO(CH_2)_rCH_3$ wherein r is an integer of 0 to 2, CHCOOH, or C=O; and $R^4$, $R^5$, $R^6$ and $R^7$ each independently represent a group selected from among alkyl groups having 1 to 3 carbon atoms.

3. The polishing composition according to claim 2, wherein the content of the reaction product of the polymerization initiator and the polymerization inhibitor is 0.001 ppb or more and 0.1 ppb or less of the polishing composition on a weight basis.

4. The polishing composition according to claim 1, wherein the amount of the polymerization inhibitor used is 0.005 wt % or more and 0.5 wt % or less with respect to the weight of the water-soluble polymer.

5. The polishing composition according to claim 1, wherein the polymerization inhibitor includes at least one compound selected from the group consisting of a compound represented by the following General Formula (1), a compound represented by the following General Formula (2), a phenothiazine compound, and a nitrosamine compound:

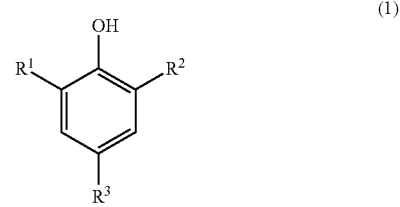
(1)

wherein $R^1$ to $R^3$ each independently represent a hydrogen atom or a group selected from the group consisting of a hydroxy group, an alkyl group having 1 to 8 carbon atoms and an alkoxy group having 1 to 8 carbon atoms, and

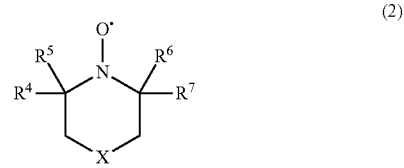
(2)

wherein X represents $CH_2$, $CH(CH_2)_pOH$ wherein p is an integer of 0 to 3, $CHO(CH_2)_qOH$ wherein q is an integer of 0 to 3, $CHO(CH_2)_rCH_3$ wherein r is an integer of 0 to 2, CHCOOH, or C=O; and $R^4$, $R^5$, $R^6$ and $R^7$ each independently represent a group selected from among alkyl groups having 1 to 3 carbon atoms.

6. The polishing composition according to claim 5, wherein the amount of the polymerization inhibitor used is 0.005 wt % or more and 0.5 wt % or less with respect to the weight of the water-soluble polymer.

7. The polishing composition according to claim 5, wherein the content of the reaction product of the polymerization initiator and the polymerization inhibitor is 0.001 ppb or more and 0.1 ppb or less of the polishing composition on a weight basis.

8. A method of polishing a silicon wafer comprising, polishing the silicon wafer with a polishing composition of claim 1.

9. A method for producing the polishing composition according to claim 1, the method comprising:
   preparing a polymer composition containing the water-soluble polymer, wherein the content of the reaction product in the polymer composition is 0.1 ppb or less with respect to the polishing composition on a weight basis; and mixing the polymer composition, the abrasive, and the basic compound.

10. A polishing composition comprising:
an abrasive;
a water-soluble polymer;
a basic compound; and
a reaction product of a polymerization initiator and a polymerization inhibitor, wherein the reaction product comprises a coupling reaction product of the polymerization initiator and the polymerization inhibitor or a chain reaction product of the polymerization inhibitor;
wherein:
   a content of the reaction product of the polymerization initiator and the polymerization inhibitor is 0.1 ppb or less of the polishing composition on a weight basis;
   the water-soluble polymer contains 10 mol % or more and 100 mol % or less of a structural unit derived from a monomer containing a nitrogen atom; and
   the water-soluble polymer is a morpholine polymer having a structural unit derived from N-(meth)acryloylmorpholine.

11. The polishing composition according to claim 10, wherein the morpholine polymer has a weight average molecular weight of 200,000 or more.

12. The polishing composition according to claim 1, wherein the abrasive is colloidal silica having an average secondary particle size of 35 nm or more.

13. The polishing composition according to claim 12, wherein the abrasive has an average aspect ratio of 1.0 or more and 1.5 or less.

14. A polishing composition comprising:
an abrasive;
a water-soluble polymer;
a basic compound; and
a reaction product of a polymerization initiator and a polymerization inhibitor, wherein the reaction product comprises a coupling reaction product of the polymerization initiator and the polymerization inhibitor or a chain reaction product of the polymerization inhibitor;
wherein:
   a content of the reaction product of the polymerization initiator and the polymerization inhibitor is 0.1 ppb or less of the polishing composition on a weight basis;
the water-soluble polymer contains 10 mol % or more and 100 mol % or less of a structural unit derived from a monomer containing a nitrogen atom; and
the reaction product comprises an aromatic ring derived from the polymerization inhibitor or a hydrophobic moiety derived from a heterocyclic amine.

* * * * *